(12) United States Patent
Lin et al.

(10) Patent No.: US 11,831,111 B2
(45) Date of Patent: Nov. 28, 2023

(54) ELECTRICAL CONNECTOR

(71) Applicant: Cheng Uei Precision Industry Co., LTD., New Taipei (TW)

(72) Inventors: Chuan-Hung Lin, New Taipei (TW); Sheng-Nan Yu, New Taipei (TW); Chun-Fu Lin, New Taipei (TW)

(73) Assignee: CHENG UEI PRECISION INDUSTRY CO., LTD., New Taipei (TW)

( * ) Notice: Subject to any disclaimer, the term of this patent is extended or adjusted under 35 U.S.C. 154(b) by 11 days.

(21) Appl. No.: 17/489,750

(22) Filed: Sep. 29, 2021

(65) Prior Publication Data
US 2022/0329025 A1    Oct. 13, 2022

(30) Foreign Application Priority Data
Apr. 8, 2021  (CN) .......................... 202120717077.6

(51) Int. Cl.
  *H01R 24/60*    (2011.01)
  *H01R 13/516*   (2006.01)
  *H05K 1/11*     (2006.01)
  *H01R 13/24*    (2006.01)
  *H01R 12/59*    (2011.01)

(52) U.S. Cl.
  CPC ........... *H01R 24/60* (2013.01); *H01R 12/592* (2013.01); *H01R 13/2407* (2013.01); *H01R 13/516* (2013.01); *H05K 1/118* (2013.01)

(58) Field of Classification Search
  CPC .. H01R 24/60; H01R 12/592; H01R 13/2407; H01R 13/516; H01K 1/118

USPC ......................................................... 439/460
See application file for complete search history.

(56) References Cited

U.S. PATENT DOCUMENTS

| | | | |
|---|---|---|---|
| 9,455,535 B1 * | 9/2016 | Chiang | H01R 13/6581 |
| 9,525,241 B1 * | 12/2016 | Su | H01R 13/6582 |
| 9,577,360 B2 * | 2/2017 | Kao | H01R 13/6593 |
| 10,680,384 B2 * | 6/2020 | Tsai | H01R 24/60 |
| 2016/0064879 A1 * | 3/2016 | Yen | H01R 24/78 439/607.01 |
| 2016/0204540 A1 * | 7/2016 | Chen | H01R 13/56 439/660 |
| 2016/0307853 A1 * | 10/2016 | Fukuchi | G06F 30/39 |
| 2017/0048968 A1 * | 2/2017 | Komatsu | H01P 11/003 |
| 2018/0175529 A1 * | 6/2018 | Wang | H01R 13/6583 |
| 2018/0212337 A1 * | 7/2018 | Chang | H01R 4/027 |
| 2018/0294604 A1 * | 10/2018 | Chien | H01R 13/516 |
| 2018/0351282 A1 * | 12/2018 | Duan | H01R 13/6583 |
| 2019/0356090 A1 * | 11/2019 | Lei | H01R 31/065 |

(Continued)

*Primary Examiner* — Alexander Gilman
(74) *Attorney, Agent, or Firm* — Cheng-Ju Chiang

(57) ABSTRACT

An electrical connector includes an insulating housing, at least one flexible printed circuit board mounted in the insulating housing, at least one location block disposed to a middle of an outer surface of the at least one flexible printed circuit board, at least one elastic structure disposed on an outer surface of the at least one location block, and a shell. The at least one flexible printed circuit board includes an outer ground layer, a signal layer and an inner ground layer. The signal layer has a plurality of traces. Each trace has a main portion, at least one contact portion and a soldering portion. The shell surrounds the insulating housing, the at least one flexible printed circuit board, the at least one location block and the at least one elastic structure.

15 Claims, 7 Drawing Sheets

(56) References Cited

U.S. PATENT DOCUMENTS

| | | | |
|---|---|---|---|
| 2020/0112128 A1* | 4/2020 | Liu | H01R 13/6585 |
| 2021/0006015 A1* | 1/2021 | Xu | H01R 13/6596 |
| 2021/0119384 A1* | 4/2021 | Kawasaki | H01R 13/5202 |
| 2021/0185809 A1* | 6/2021 | Park | H05K 1/0225 |
| 2021/0265751 A1* | 8/2021 | Lou | H01R 13/6582 |
| 2022/0216629 A1* | 7/2022 | Huang | H01R 12/79 |
| 2022/0329025 A1* | 10/2022 | Lin | H05K 1/118 |

* cited by examiner

ELECTRICAL CONNECTOR

CROSS-REFERENCE TO RELATED APPLICATION

The present application is based on, and claims priority from, China Patent Application No. 202120717077.6, filed Apr. 8, 2021, the disclosure of which is hereby incorporated by reference herein in its entirety.

BACKGROUND OF THE INVENTION

1. Field of the Invention

The present invention generally relates to an electrical connector, and more particularly to an electrical connector having a simplified process and a simplified circuit layout, and lowering a cost of the electrical connector.

2. The Related Art

Nowadays, various types of connectors are used by various electronic products frequently. In the various types of the connectors, universal serial bus (USB) connectors are the most widely used connectors. With the improvement of science and technology, kinds of the universal serial bus connectors are more and more, such as USB 2.0, USB 3.0, Micro USB, Mini USB or USB Type-C. The USB Type-C connectors have been widely applied in the various electronic products.

Conventionally, an electrical connector includes an elastic terminal, a flexible printed circuit board and an interface. The elastic terminal is U-shaped. The electrical connector can proceed with a high-speed data transmission, and the electrical connector has a high quality signal and a better reliability. The flexible printed circuit board is a three-layer board. Sometimes, the flexible printed circuit board has three signal layers. Three layers of the flexible printed circuit board all have a plurality of connecting holes. The three layers of the flexible printed circuit board are connected by the plurality of the connecting holes.

However, the elastic terminal of the electrical connector is difficult to be stamped to cause a difficult manufacturing process, and an actuating arm of the elastic terminal is shorter. Moreover, an internal circuit layout of the flexible printed circuit board is more complicated, a quantity of the plurality of the connecting holes is larger, and the plurality of the connecting holes of each end of each layer of the flexible printed circuit board are densely distributed, so the three layers of the flexible printed circuit board all need complex through hole processes. Thus, a manufacturing difficulty of the electrical connector is increased, and a cost of the electrical connector is also increased.

Thus, in order to improve the above-mentioned problems, it is essential to provide an innovative electrical connector having a simplified manufacturing process and a simplified circuit layout, and lowering a cost of the electrical connector.

SUMMARY OF THE INVENTION

An object of the present invention is to provide an electrical connector. The electrical connector includes an insulating housing, at least one flexible printed circuit board mounted in the insulating housing, at least one location block disposed to a middle of an outer surface of the at least one flexible printed circuit board, at least one elastic structure disposed on a front end of an outer surface of the at least one location block, and a shell. The at least one flexible printed circuit board includes an outer ground layer, a signal layer and an inner ground layer. The outer ground layer is disposed to an outer surface of the signal layer. The inner ground layer is disposed to an inner surface of the signal layer. The signal layer has a plurality of traces. Each trace has a main portion, at least one contact portion and a soldering portion. At least one portion of a front end of the main portion extends frontward to form the at least one contact portion. A rear end of the main portion extends rearward to form the soldering portion. The at least one location block has a board body. A front end of an outer surface of the board body protrudes outward to form at least one location portion. The at least one elastic structure has a fastening portion, and at least one location hole penetrating through an outer surface and an inner surface of the fastening portion. The at least one location portion is fastened to the at least one location hole. Several portions of a front end of the fastening portion extends frontward and then is arched inward to form a plurality of elastic arms. The plurality of the elastic arms are fastened to an outer surface of the outer ground layer of the at least one flexible printed circuit board, and each elastic arm is corresponding to the at least one contact portion of the at least one flexible printed circuit board. The shell surrounds the insulating housing, the main portion and the at least one contact portion of the at least one flexible printed circuit board, the at least one location block and the at least one elastic structure.

Another object of the present invention is to provide an electrical connector. The electrical connector includes an insulating housing, a signal layer mounted in the insulating housing, an outer ground layer, an inner ground layer, at least one location block, at least one elastic structure and a shell. The signal layer has a plurality of traces. Each trace has a main portion. At least one portion of a front end of the main portion extends frontward to form at least one contact portion. A rear end of the main portion extends rearward to form a soldering portion. The outer ground layer is disposed to an outer surface of the signal layer. The inner ground layer is disposed to an inner surface of the signal layer. The at least one location block is disposed to a middle of an outer surface of the outer ground layer. The at least one location block has a board body. A front end of an outer surface of the board body protrudes outward to form at least one location portion. The at least one elastic structure is disposed on a front end of an outer surface of the at least one location block. The at least one elastic structure has a fastening portion, and at least one location hole penetrating through an outer surface and an inner surface of the fastening portion. The at least one location portion is fastened to the at least one location hole. Several portions of a front end of the fastening portion extend frontward and then are arched inward to form a plurality of elastic arms. The plurality of the elastic arms are fastened to the outer surface of the outer ground layer, and each elastic arm is corresponding to the at least one contact portion. The shell surrounds the insulating housing, the main portion and the at least one contact portion of the signal layer, the outer ground layer, the inner ground layer, the at least one location block and the at least one elastic structure.

Another object of the present invention is to provide an electrical connector. The electrical connector includes an insulating housing, two flexible printed circuit boards, two location blocks, two elastic structures and a shell. The insulating housing has an upper body, a lower body, and a connecting element connected between the upper body and the lower body. One flexible printed circuit board is mounted to an upper portion of the insulating housing. The other flexible printed circuit board is mounted to a lower portion of the insulating housing. The two flexible printed circuit boards are opposite to each other along an up-down direction. The two flexible printed circuit boards are separated by the connecting element. Each flexible printed circuit board includes an outer ground layer, a signal layer and an inner ground layer. The outer ground layer is disposed to an outer surface of the signal layer. The inner ground layer is disposed to an inner surface of the signal layer. The signal layer has a plurality of traces. Each trace has a main portion. At least one portion of a front end of the main portion extends frontward to form at least one contact portion. A rear end of the main portion extends rearward to form a soldering portion. The two location blocks are disposed to two outer surfaces of the two outer ground layers of the two flexible printed circuit boards. The two location blocks are corresponding to the two main portions of the two signal layers of the two flexible printed circuit boards. Each location block includes a board body. A front end of an outer surface of the board body protrudes outward to form at least one location portion. The two elastic structures are disposed to the two front ends of the two outer surfaces of the two board bodies of the two location blocks. Each elastic structure has a fastening portion, and at least one location hole penetrating through an outer surface and an inner surface of the fastening portion. The at least one location portion is fastened to the at least one location hole. Several portions of a front end of the fastening portion extend frontward and then are arched inward to form a plurality of elastic arms. Front ends of the plurality of the elastic arms of the two elastic structures are attached to the two outer surfaces of the two outer ground layers of the two flexible printed circuit boards, and the plurality of the elastic arms of the two elastic structures are corresponding to the plurality of the contact portions of the two flexible printed circuit boards. The two elastic structures are disposed to the two front ends of the two outer surfaces of the two board bodies of the two location blocks. Each elastic structure has a fastening portion, and at least one location hole penetrating through an outer surface and an inner surface of the fastening portion. The at least one location portion is fastened to the at least one location hole. Several portions of a front end of the fastening portion extend frontward and then are arched inward to form a plurality of elastic arms. Front ends of the plurality of the elastic arms of the two elastic structures are attached to the two outer surfaces of the two outer ground layers of the two flexible printed circuit boards, and the plurality of the elastic arms of the two elastic structures are corresponding to the plurality of the contact portions of the two flexible printed circuit boards. The shell surrounds the insulating housing, the two main portions and the plurality of the contact portions of the two signal layers of the two flexible printed circuit boards, the two location blocks and the two elastic structures.

As described above, a design of the electrical connector is innovative, each flexible printed circuit board includes the outer ground layer, the signal layer and the inner ground layer. The outer ground layer is disposed to the outer surface of the signal layer. The inner ground layer is disposed to the inner surface of the signal layer. The outer ground layer and the inner ground layer are used for reducing a signal interference. The signal layer has a signal transmission function and a power transmission function, so each flexible printed circuit board has a better shielding function to reduce an electromagnetic interference so as to make that the electrical connector transmits a signal more steadily. The two elastic structures are used for providing positive forces of the electrical connector during a period of an insertion and a withdrawal of the electrical connector, the front end of the fastening portion extends frontward and then is arched inward to form the plurality of the elastic arms, the plurality of the elastic arms of the two elastic structures are attached to the two outer surfaces of the two outer ground layers of the two flexible printed circuit boards, the plurality of the elastic arms of the two elastic structures are corresponding to the plurality of the contact portions of the two flexible printed circuit boards, and a quantity of the plurality of the elastic arms of the two elastic structures is equal to a quantity of the plurality of the contact portions of the two flexible printed circuit boards. As a result, the electrical connector has a simplified process and a simplified circuit layout, and lowers a cost of the electrical connector.

BRIEF DESCRIPTION OF THE DRAWINGS

The present invention will be apparent to those skilled in the art by reading the following description, with reference to the attached drawings, in which.

DETAILED DESCRIPTION OF THE PREFERRED EMBODIMENT

Figure 1:
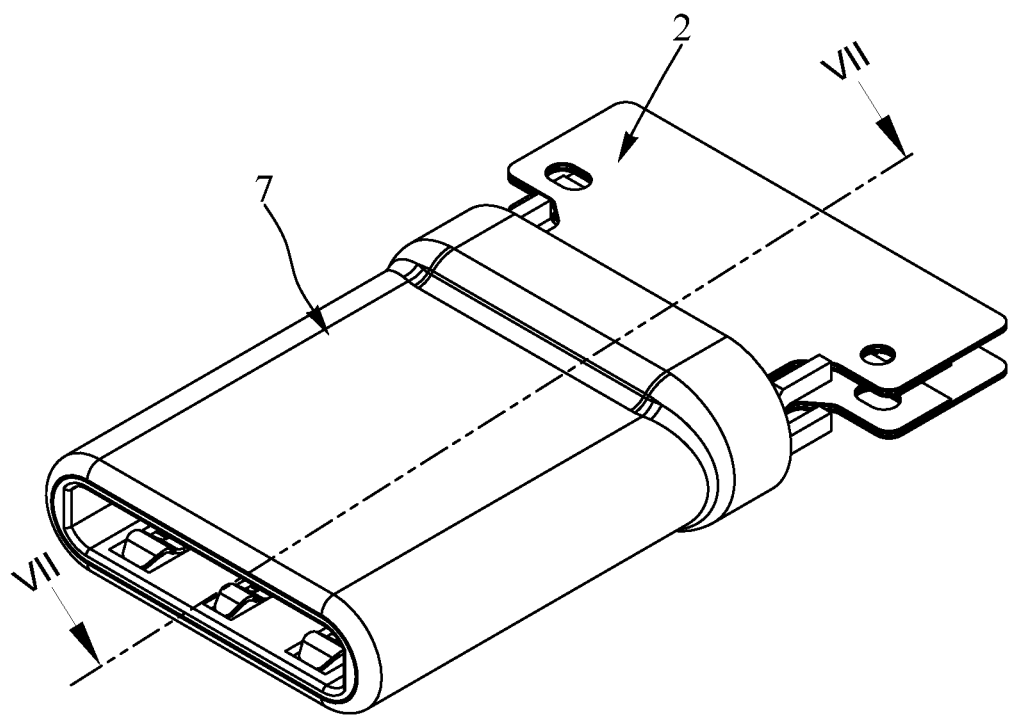
FIG. 1 is a perspective view of an electrical connector in accordance with the present invention.
Figure 2:
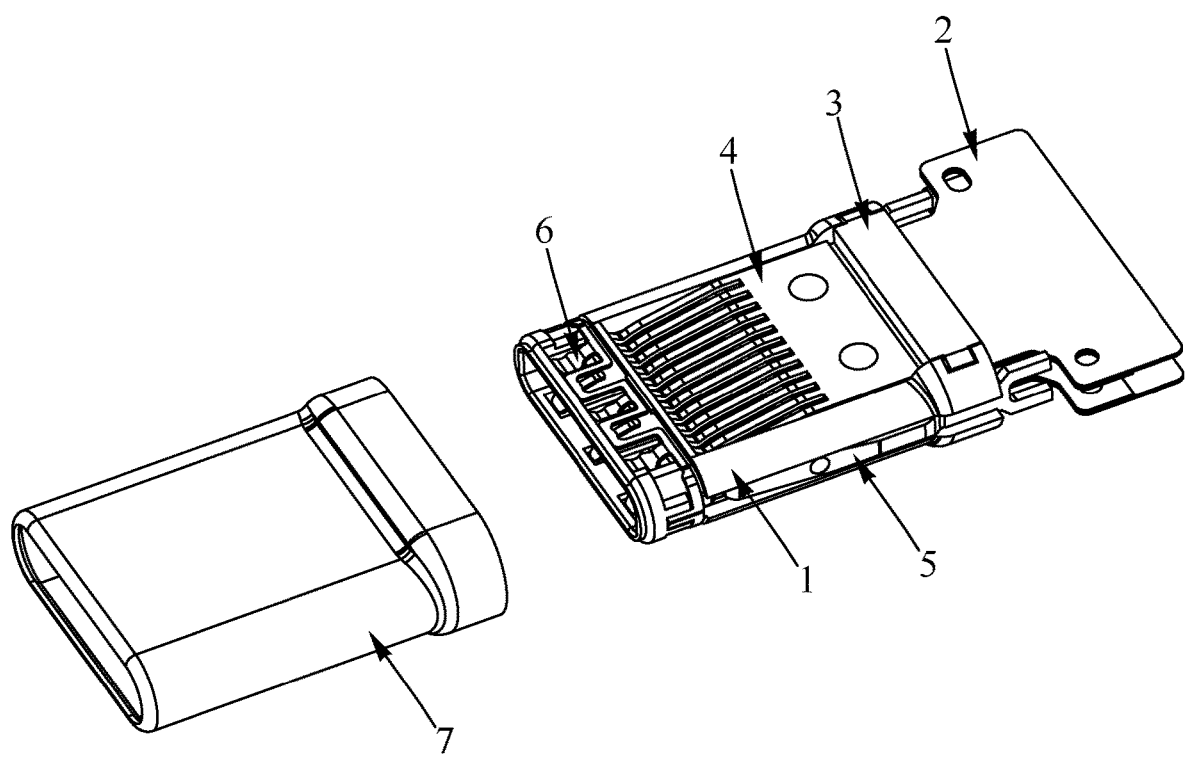
FIG. 2 is a partially exploded view of the electrical connector of FIG. 1.
Figure 3:
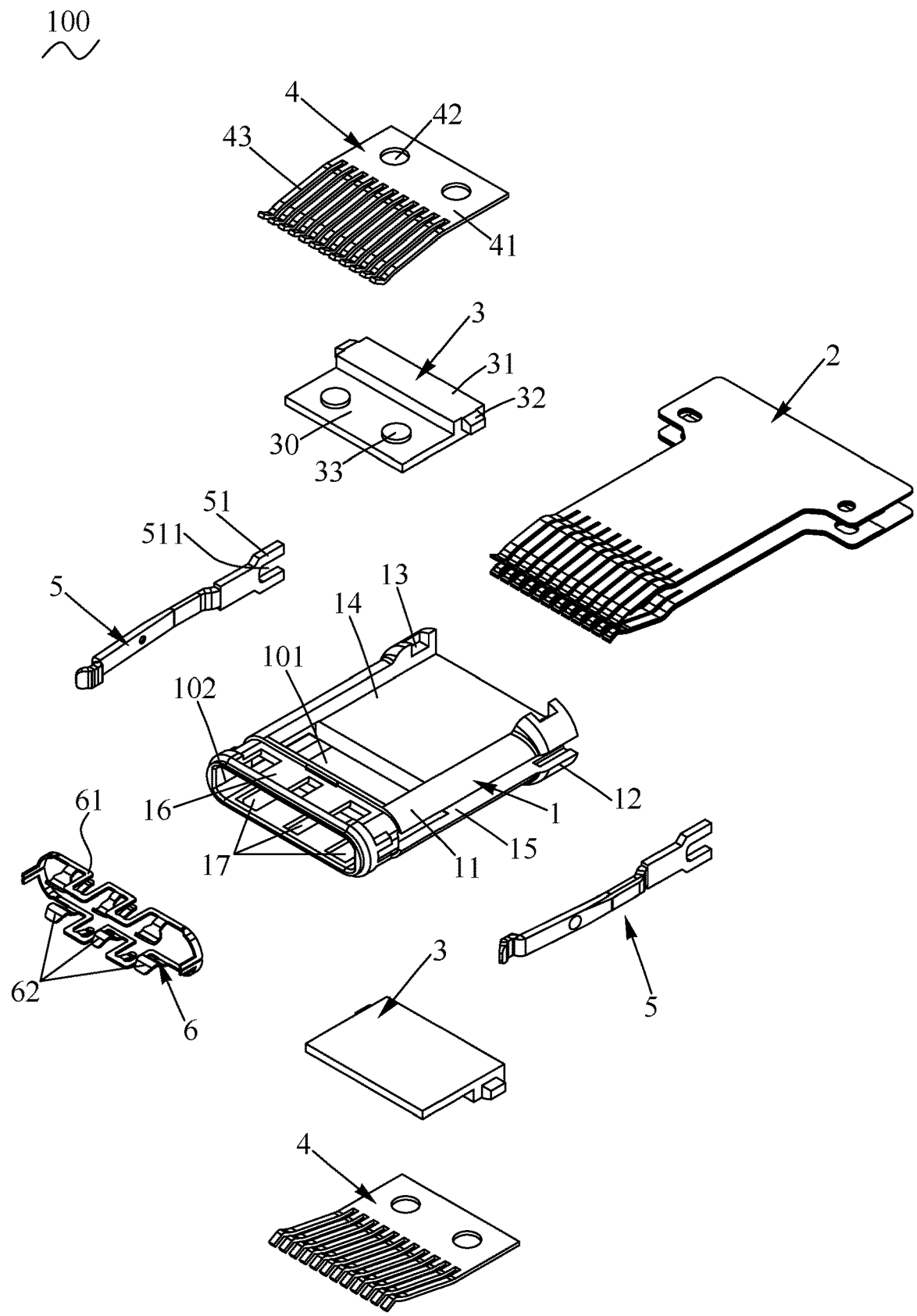
FIG. 3 is an exploded view of the electrical connector of FIG. 1.

With reference to FIG. 1 to FIG. 3, an electrical connector 100 in accordance with the present invention is shown. The electrical connector 100 includes an insulating housing 1, at least one flexible printed circuit (FPC) board 2, at least one location block 3, at least one elastic structure 4, at least one latch 5, at least one shielding plate 6 and a shell 7. The at least one flexible printed circuit board 2, the at least one location block 3, the at least one elastic structure 4, the at least one latch 5 and the at least one shielding plate 6 are mounted to the insulating housing 1. The shell 7 surrounds the insulating housing 1, the at least one flexible printed circuit board 2, the at least one location block 3, the at least one elastic structure 4, the at least one latch 5 and the at least one shielding plate 6.

Preferably, the electrical connector 100 includes two flexible printed circuit boards 2, two location blocks 3, two elastic structures 4, two latches 5 and two shielding plates 6. The two flexible printed circuit boards 2, the two location blocks 3, the two elastic structures 4, the two latches 5 and the two shielding plates 6 are mounted to the insulating housing 1. The shell 7 surrounds the insulating housing 1, the two flexible printed circuit boards 2, the two location blocks 3, the two elastic structures 4, the two latches 5 and the two shielding plates 6. The electrical connector 100 has a better transmission speed, and the electrical connector 100 has a better shielding function to be able to reduce an external interference, so that the electrical connector 100 transmits a signal more stably. In the present invention, the electrical connector 100 is a USB Type-C connector. In a concrete implementation, the electrical connector 100 is able to be another type of connector which is different from the USB Type-C connector.

The two flexible printed circuit boards 2 are both disposed horizontally. The two flexible printed circuit boards 2 are mounted in the insulating housing 1, and the two flexible printed circuit boards 2 are opposite to each other along an up-down direction. One flexible printed circuit board 2 is mounted to a middle of an upper portion of the insulating housing 1 and a rear of the upper portion of the insulating housing 1. The other flexible printed circuit board 2 is mounted to a middle of a lower portion of the insulating housing 1 and a rear of the lower portion of the insulating housing 1. The two location blocks 3 are disposed horizontally. The two location blocks 3 are mounted to a rear end of the insulating housing 1, and the two location blocks 3 are opposite to each other along the up-down direction. The two location blocks 3 are mounted to the rear of the upper portion and the rear of the lower portion of the insulating housing 1, respectively. The two location blocks 3 are located to two middles of two outer surfaces of the two flexible printed circuit boards 2, respectively.

The two elastic structures 4 are disposed horizontally. The two elastic structures 4 are mounted in the insulating housing 1, and the two elastic structures 4 are opposite to each other along the up-down direction. One elastic structure 4 is mounted to a front of the upper portion of the insulating housing 1 and the middle of the upper portion of the insulating housing 1. The other elastic structure 4 is mounted to a front of the lower portion of the insulating housing 1 and the middle of the lower portion of the insulating housing 1. The two elastic structures 4 are located to two fronts of two outer surfaces of the two location blocks 3, respectively. The two elastic structures 4 clamp two fronts of the two outer surfaces of the two flexible printed circuit boards 2. The two elastic structures 4 are adjacent to the two fronts of the two outer surfaces of the two flexible printed circuit boards 2, and the two elastic structures 4 are spaced from the two fronts of the two outer surfaces of the two flexible printed circuit boards 2.

The two latches 5 are disposed vertically. The two latches 5 are mounted to two opposite sides of the insulating housing 1. The two latches 5 are opposite to each other along a transverse direction. The two shielding plates 6 are mounted to the front of the upper portion of the insulating housing 1 and the front of the lower portion of the insulating housing 1. The two shielding plates 6 are mounted to a front end of the insulating housing 1, and the two shielding plates 6 are opposite to each other along the up-down direction. Each elastic structure 4 is located between one location block 3 and one shielding plate 6. The two shielding plates 6 are located in front of the two flexible printed circuit boards 2, the two location blocks 3, the two elastic structures 4 and the two latches 5.

Referring to FIG. 3, the insulating housing 1 has an upper body 11, a lower body 12, at least two fastening grooves 13, a connecting element 14, a plurality of receiving grooves 15, a plurality of concave surfaces 16 and a plurality of perforations 17. Preferably, the insulating housing 1 has a plurality of the fastening grooves 13. The upper body 11 is shown as a U shape seen from a top view, and the lower body 12 is shown as another U shape seen from a bottom view. A middle of a rear end of the upper body 11 is opened freely, and a middle of a rear end of the lower body 12 is opened freely.

A rear end of an upper surface of the insulating housing 1 is recessed inward to form at least one fastening groove 13, and a rear end of a lower surface of the insulating housing 1 is recessed inward to form at least one fastening groove 13. Two top surfaces of two opposite sides of the rear end of the upper body 11 are recessed inward to form two fastening grooves 13 penetrating through two facing inner surfaces of the two opposite sides of the rear end of the upper body 11. The two fastening grooves 13 of the upper body 11 of the insulating housing 1 are aligned along the transverse direction. Two bottom surfaces of two opposite sides of the rear end of the lower body 12 are recessed inward to form another two fastening grooves 13 penetrating through two facing inner surfaces of the two opposite sides of the rear end of the lower body 12. The two fastening grooves 13 of the lower body 12 of the insulating housing 1 are aligned along the transverse direction. The plurality of the fastening grooves 13 of the insulating housing 1 are used for being buckled with corresponding structures of the two location blocks 3, and inner walls of the plurality of the fastening grooves 13 of the insulating housing 1 are used for blocking the corresponding structures of the two location blocks 3, so that the two location blocks 3 are located to the insulating housing 1, and the two location blocks 3 are fixed to the insulating housing 1.

The connecting element 14 is connected between inner portions of the two opposite sides of the insulating housing 1. The connecting element 14 is connected between the middle of the rear end of the upper body 11 and the middle of the rear end of the lower body 12. The insulating housing 1 has an interval 101 penetrating through middles and the rear ends of the upper body 11 and the lower body 12 of the insulating housing 1. The connecting element 14 is connected among two bottoms of two side walls of the upper body 11 of the insulating housing 1 and two tops of two side walls of the lower body 12 of the insulating housing 1. The connecting element 14 is located in a rear end of the interval 101 and is located among the plurality of the fastening grooves 13. The connecting element 14 is shown as a rectangular shape. The connecting element 14 is located between and abuts between the two flexible printed circuit boards 2. The connecting element 14 separates the two flexible printed circuit boards 2. The two flexible printed circuit boards 2 are separated by the connecting element 14, so that the two flexible printed circuit boards 2 are correspondingly disposed along the up-down direction, the two flexible printed circuit boards 2 are arranged opposite to each other, and the two flexible printed circuit boards 2 are contactless.

Two middles and two rear ends of the two side walls of the upper body 11 are spaced from two middles and two rear ends of the two side walls of the lower body 12 to form the two receiving grooves 15 among the two middles and the two rear ends of the two side walls of the upper body 11 and the two middles and the two rear ends of the two side walls of the lower body 12. The two receiving grooves 15 are disposed to the two opposite sides of the insulating housing 1. The two receiving grooves 15 are formed among left sides and right sides of the upper body 11 and the lower body 12. The two receiving grooves 15 are abreast disposed along the transverse direction. Each receiving groove 15 extends along a longitudinal direction. The longitudinal direction is perpendicular to the transverse direction. The two receiving grooves 15 are opposite to each other. The two latches 5 are located in the two receiving grooves 15 of the insulating housing 1.

An upper surface and a lower surface of the front end of the insulating housing 1 are recessed inward to form the two concave surfaces 16. An upper surface of a front end of the upper body 11 is recessed inward to form one concave surface 16, and a lower surface of a front end of the lower body 12 is recessed inward to form the other concave surface 16. The two concave surfaces 16 are disposed along the up-down direction. The two concave surfaces 16 are opposite to each other. The two shielding plates 6 are mounted to the two concave surfaces 16 of the insulating housing 1.

The front end of the insulating housing 1 defines an accommodating space 102 penetrating through a front surface of the insulating housing 1 along the longitudinal direction. The accommodating space 102 is communicated between the interval 101 and an outside space. The accommodating space 102 is surrounded between the front end of the upper body 11 and the front end of the lower body 12.

The two concave surfaces 16 of the insulating housing 1 define the plurality of the perforations 17 penetrating through a top wall and a bottom wall of the accommodating space 102. The plurality of the perforations 17 penetrate through two front ends of two middles of the two concave surfaces 16 of the insulating housing 1. The plurality of the perforations 17 penetrate through the front end of the upper body 11 and the front end of the lower body 12 along the up-down direction. The plurality of the perforations 17 are located in front of the interval 101. Corresponding mechanisms of the two shielding plates 6 are fastened to the plurality of the perforations 17, so that the two shielding plates 6 are located to the insulating housing 1, and the two shielding plates 6 are fixed to the insulating housing 1. Specifically, the insulating housing 1 has six perforations 17. The six perforations 17 are divided into two groups. Each group of the perforations 17 includes three perforations 17. The insulating housing 1 has one group of the perforations 17, namely three perforations 17 penetrating through one concave surface 16 of the insulating housing 1, and the insulating housing 1 has the other group of the perforations 17, namely the other three perforations 17 penetrating through the other concave surface 16 of the insulating housing 1.

Referring to FIG. 2 to FIG. 7, the at least one flexible printed circuit board 2 is mounted in the insulating housing 1. The at least one flexible printed circuit board 2 includes an outer ground layer 21, a signal layer 22 and an inner ground layer 23, so each flexible printed circuit board 2 includes the outer ground layer 21, the signal layer 22 and the inner ground layer 23. The signal layer 22 is mounted in the insulating housing 1. The outer ground layer 21 is disposed to an outer surface of the signal layer 22. The inner ground layer 23 is disposed to an inner surface of the signal layer 22. The outer ground layer 21 and the inner ground layer 23 are used for reducing a signal interference. The signal layer 22 has a signal transmission function and a power transmission function, so each flexible printed circuit board 2 has the better shielding function to reduce an electromagnetic interference so as to make that the electrical connector 100 transmits the signal more steadily. In the present invention, a circuit layout of each flexible printed circuit board 2 is simpler, so the electrical connector 100 has the simplified circuit layout and lowers a cost of the electrical connector 100.

The signal layer 22 has a plurality of traces 220. The plurality of the traces 220 are formed in the signal layer 22. In one situation, each trace 220 has a main portion 221, at least one contact portion 222 and a soldering portion 223. At least one portion of a front end of the main portion 221 extends frontward to form the at least one contact portion 222. In another situation, each trace 220 has the main portion 221, a plurality of the contact portions 222 and the soldering portion 223. Several portions of the front end of the main portion 221 extend frontward to form the plurality of the contact portion 222. Each contact portion 222 is used for contacting a docking terminal (not shown) of a docking connector (not shown). A rear end of the main portion 221 extends rearward to form the soldering portion 223. The plurality of the contact portions 222 and the soldering portion 223 are exposed to the inner surface of the signal layer 22. The soldering portion 223 is used for connecting with a circuitry board (not shown). The shell 7 surrounds the insulating housing 1, the main portion 221 and the at least one contact portion 222 of the signal layer 22 of the at least one flexible printed circuit board 2, the at least one location block 3 and the at least one elastic structure 4.

In the present invention, a length of the outer ground layer 21 is equal to a length of the signal layer 22 along the longitudinal direction. The length of the signal layer 22 is longer than a length of the inner ground layer 23 along the longitudinal direction, so each contact portion 222 of the signal layer 22 is exposed out to a front end of the inner ground layer 23. Each contact portion 222 of the signal layer 22 projects beyond a front surface of the inner ground layer 23. The outer ground layer 21 is adhered to the outer surface of the signal layer 22. The outer ground layer 21 is adhered to an outer surface of the main portion 221, an outer surface of each contact portion 222 and an outer surface of the soldering portion 223. The inner ground layer 23 is adhered to the inner surface of the signal layer 22. The inner ground layer 23 is adhered to an inner surface of the main portion 221. In the one situation, a width of the at least one contact portion 222 of the signal layer 22 is without exceeding a width of the soldering portion 223 of the signal layer 22. In the other situation, widths of the plurality of the contact portions 222 are without exceeding the width of the soldering portion 223.

Figure 5:
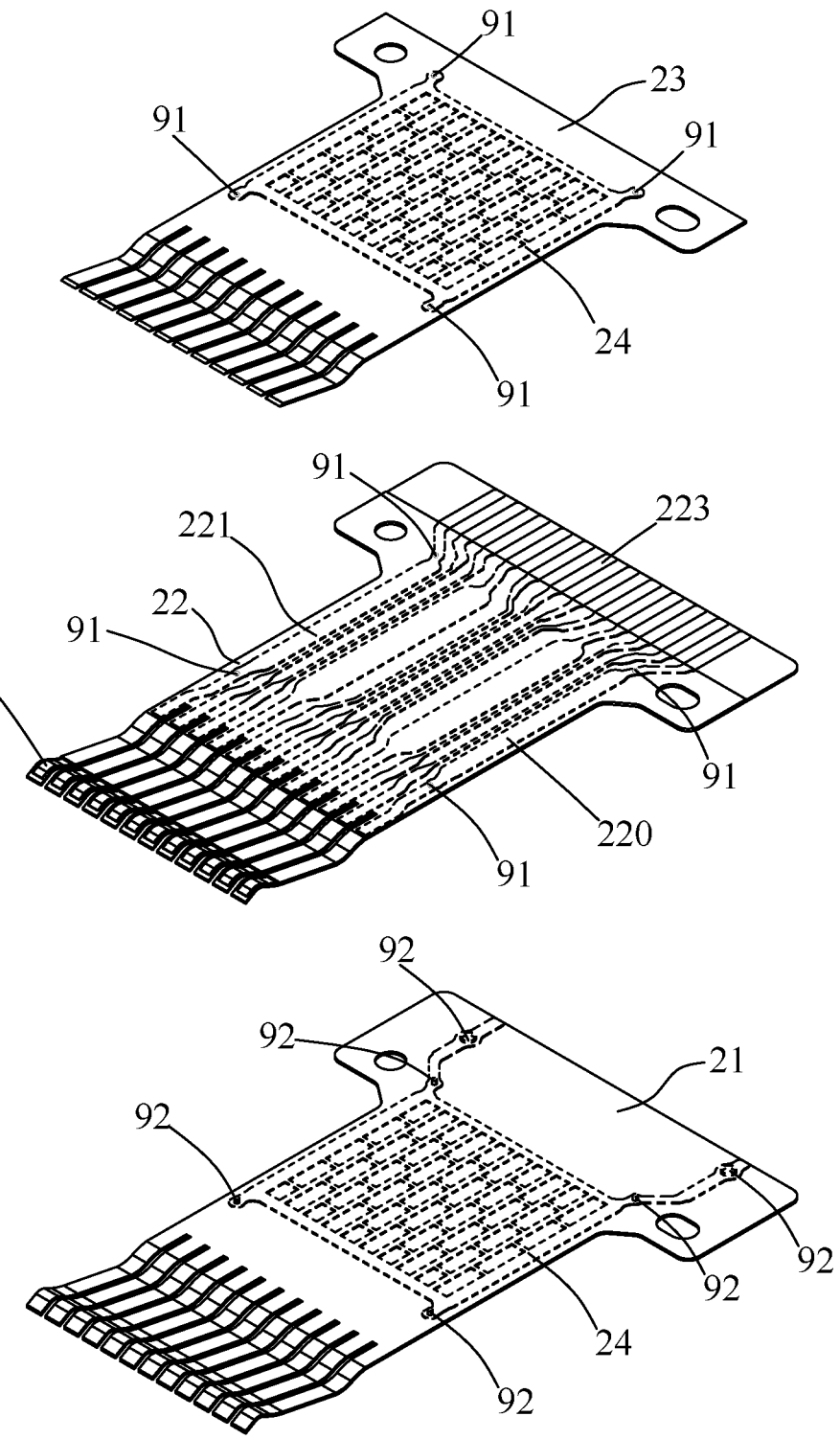
FIG. 5 is a diagrammatic drawing of the flexible printed circuit board of the electrical connector in accordance with a first preferred embodiment of the present invention, wherein the flexible printed circuit board has a mesh structure.

Referring to FIG. 1 and FIG. 5, a flexible printed circuit (FPC) board 2 of the electrical connector 100 in accordance with a first preferred embodiment is shown in FIG. 5. In the first preferred embodiment, a middle of the outer ground layer 21 and a middle of the inner ground layer 23 are equipped with two mesh structures 24, so the outer ground layer 21 and the inner ground layer 23 have better high frequency characteristics. The two mesh structures 24 of the outer ground layer 21 and the inner ground layer 23 are corresponding to positions of the inner surface and the outer surface of the main portion 221 of the signal layer 22. Each mesh structure 24 is formed by etching a flexible copper foil substrate. The two mesh structures 24 are formed inside the outer ground layer 21 and the inner ground layer 23, respectively.

Figure 6:
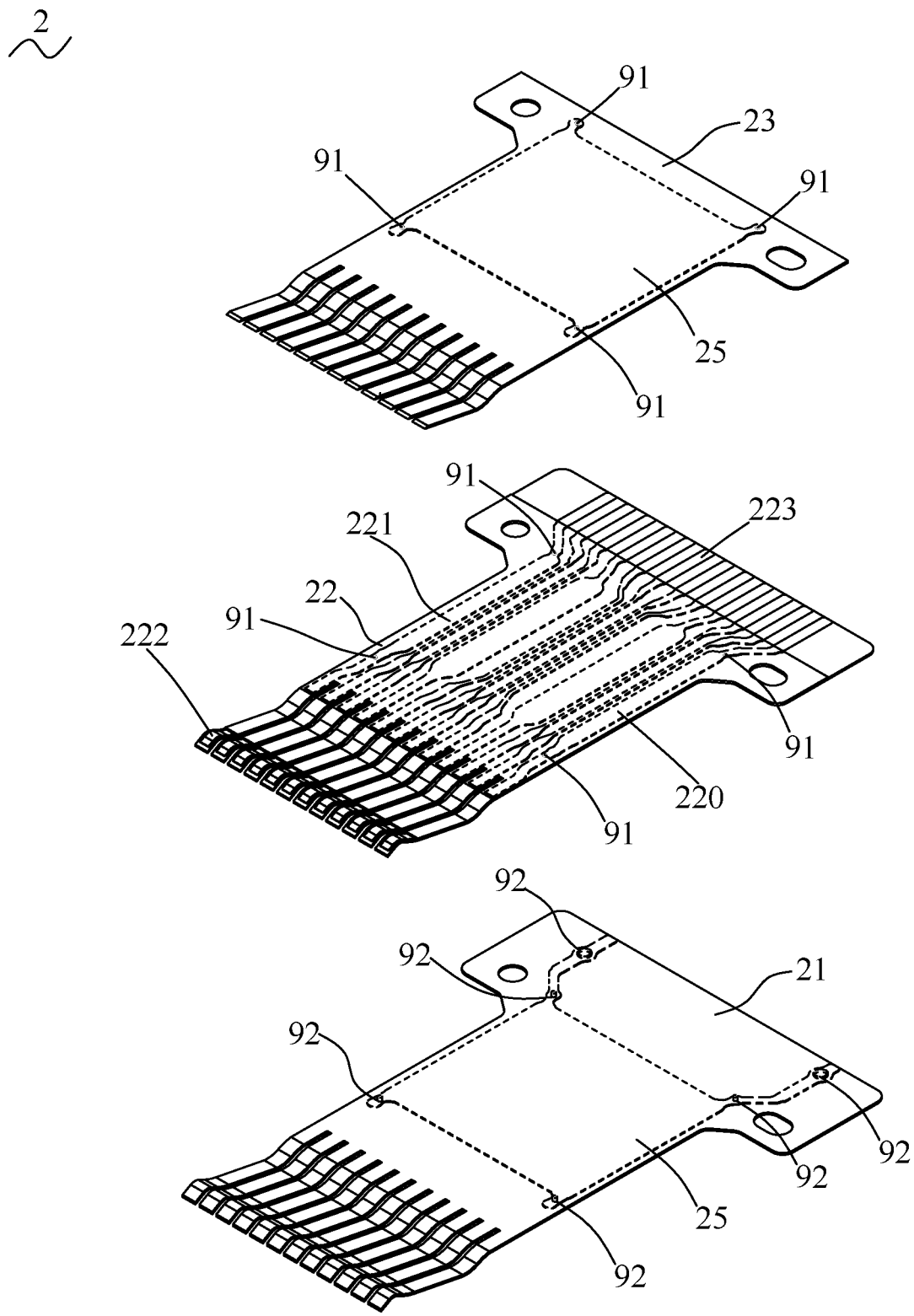
FIG. 6 is a diagrammatic drawing of the flexible printed circuit board of the electrical connector in accordance with a second preferred embodiment of the present invention, wherein the flexible printed circuit board has a slice structure.
Figure 7:
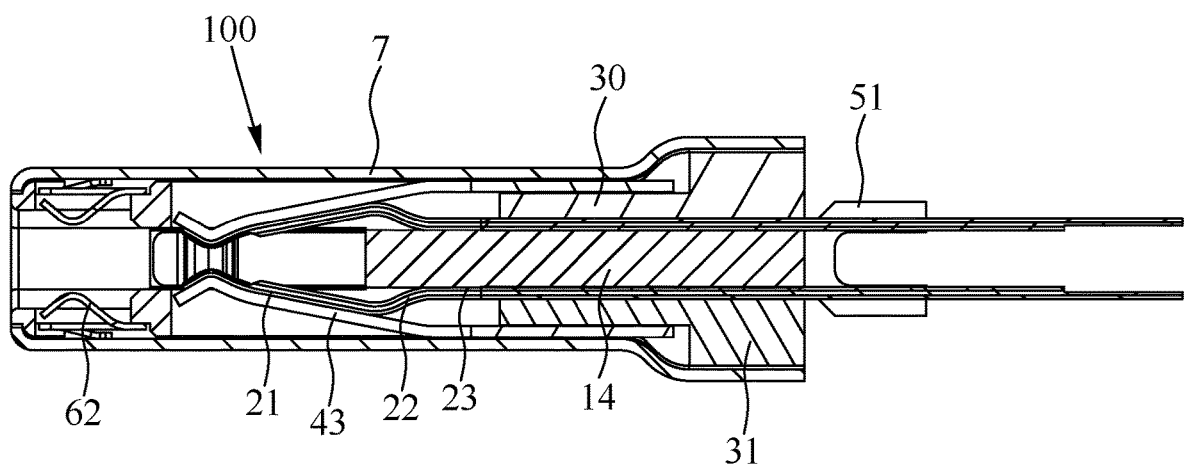
FIG. 7 is a sectional view of the electrical connector along a line VII-VII of FIG. 1.

Referring to FIG. 1 to FIG. 6, a flexible printed circuit (FPC) board 2 of the electrical connector 100 in accordance with a second preferred embodiment is shown in FIG. 6. In the second preferred embodiment, the middle of the outer ground layer 21 and the middle of the inner ground layer 23 are equipped with two slice structures 25. Each slice structure 25 is a structure without a mesh. The two slice structures 25 of the outer ground layer 21 and the inner ground layer 23 are corresponding to the positions of the inner surface and the outer surface of the main portion 221 of the signal layer 22. In the concrete implementation, the outer ground layer 21 and the inner ground layer 23 are able to be designed to other shapes, so the outer ground layer 21 and the inner ground layer 23 have the better high frequency characteristics simultaneously. In the second preferred embodiment, each slice structure 25 is formed by etching the flexible copper foil substrate (not shown). The two slice structures 25 are formed inside the outer ground layer 21 and the inner ground layer 23, respectively.

Figure 4:
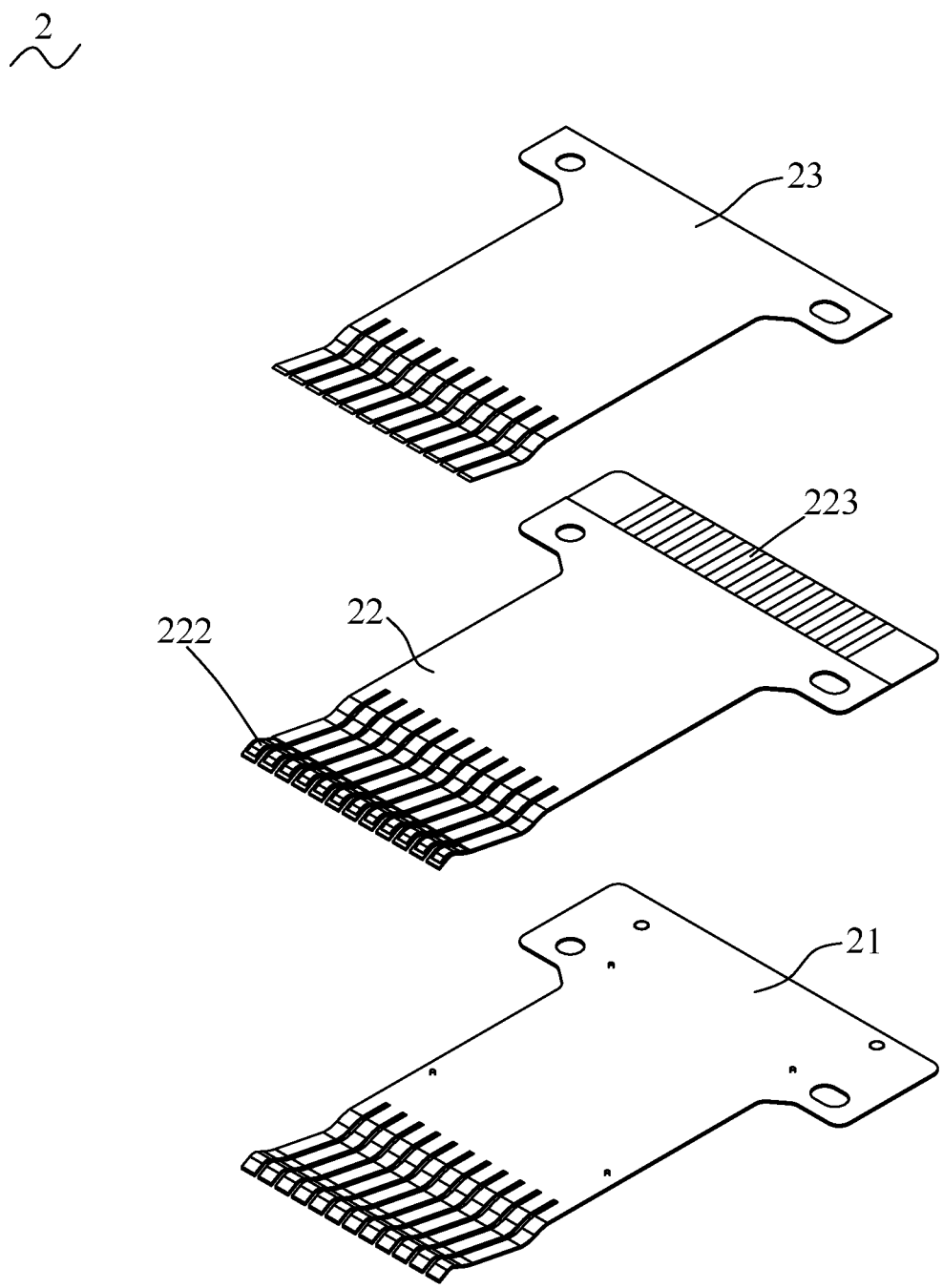
FIG. 4 is an exploded view of a flexible printed circuit board of the electrical connector of FIG. 1.

Referring to FIG. 2, FIG. 3 and FIG. 4, the at least one location block 3 is disposed to a middle of an outer surface of the at least one flexible printed circuit board 2. The at least one location block 3 is disposed to a middle of an outer surface of the outer ground layer 21 of the at least one flexible printed circuit board 2. The at least one location block 3 has a board body 30. The two location blocks 3 are disposed to the two outer surfaces of the two outer ground layers 21 of the two flexible printed circuit boards 2. The two location blocks 3 are corresponding to the two main portions 221 of the two signal layers 22. Each location block 3 has the board body 30, a protruding portion 31, at least two location feet 32 and at least one location portion 33.

Specifically, each location block 3 has the board body 30, the protruding portion 31, two location feet 32 and two location portions 33. A rear end of an outer surface of the board body 30 of each location block 3 protrudes outward to form the protruding portion 31. At least one portion of the protruding portion 31 of each location block 3 protrudes outward and laterally to form at least one location foot 32. The at least two location feet 32 of the two location blocks 3 are fastened in the at least two fastening grooves 13 of the insulating housing 1. Middles of two opposite sides of the protruding portion 31 of each location block 3 protrude outward to form the two location feet 32. The two location feet 32 of each location block 3 are fastened in the two fastening grooves 13 of one of the upper body 11 and the lower body 12 of the insulating housing 1, so that the two location blocks 3 are located to the insulating housing 1, and the two location blocks 3 are fixed to the insulating housing 1.

A front end of the outer surface of the board body 30 protrudes outward to form the at least one location portion 33. The at least two location portions 33 of the two location blocks 3 extend towards the two elastic structures 4. The at least two location portions 33 of the two location blocks 3 are fastened to corresponding portions of the two elastic structures 4, so that the two elastic structures 4 are located to the two location blocks 3, and the two elastic structures 4 are fixed to the two location blocks 3. Two sides of the front end of the outer surface of the board body 30 protrude outward to form the two location portions 33. A height of the at least one location portion 33 is without exceeding a height of the protruding portion 31 in the up-down direction. The protruding portion 31 and the at least one location portion 33 are separated from each other, and the protruding portion 31 and the at least one location portion 33 are contactless.

The at least one elastic structure 4 is disposed on a front end of an outer surface of the at least one location block 3. The at least one elastic structure 4 has a fastening portion 41, and at least one location hole 42 penetrating through an outer surface and an inner surface of the fastening portion 41. The at least one location portion 33 is fastened to the at least one location hole 42. The two elastic structures 4 are disposed to the two front ends of the two outer surfaces of the two board bodies 30 of the two location blocks 3. The two elastic structures 4 project beyond front surfaces of the two board bodies 30. The two elastic structures 4 are received in a front end of the interval 101. The two elastic structures 4 are used for providing a positive force of the electrical connector 100 during a period of an insertion and a withdrawal of the electrical connector 100. Each elastic structure 4 has the fastening portion 41, the at least one location hole 42 and a plurality of elastic arms 43. The at least one location hole 42 of each elastic structure 4 penetrates through the outer surface and the inner surface of the fastening portion 41 of each elastic structure 4.

Specifically, each elastic structure 4 has the fastening portion 41, two location holes 42 and the plurality of the elastic arms 43. The fastening portion 41 of each elastic structure 4 is fastened to the front end of the outer surface of the board body 30 of the one location block 3. The two location holes 42 penetrate through the outer surface and the inner surface of the fastening portion 41. The two location portions 33 of the two location blocks 3 are fastened to the two location holes 42 of the two elastic structures 4, so that the two elastic structures 4 are located to the two location blocks 3, and the two elastic structures 4 are fixed to the two location blocks 3.

Several portions of a front end of the fastening portion 41 extend frontward and then is arched inward to form the plurality of the elastic arms 43. The plurality of the elastic arms 43 are fastened to the outer surface of the outer ground layer 21 of the at least one flexible printed circuit board 2, and each elastic arm 43 is corresponding to the at least one contact portion 222 of the at least one flexible printed circuit board 2. Front ends of the plurality of the elastic arms 43 of the two elastic structures 4 are attached to the two outer surfaces of the two outer ground layers 21 of the two flexible printed circuit boards 2, and the front ends of the plurality of the elastic arms 43 of the two elastic structures 4 are fastened to the two outer surfaces of the two outer ground layers 21 of the two flexible printed circuit boards 2, so that the two elastic structures 4 are located to the two flexible printed circuit boards 2, and the two elastic structures 4 are fixed to the two flexible printed circuit boards 2. The plurality of the elastic arms 43 of the two elastic structures 4 are corresponding to the plurality of the contact portions 222 of the two flexible printed circuit boards 2.

The plurality of the elastic arms 43 of the two elastic structures 4 are corresponding to two front ends of the two outer ground layers 21 of the two flexible printed circuit boards 2 and the plurality of the contact portions 222 of the two signal layers 22 of the two flexible printed circuit boards 2. A quantity of the plurality of the elastic arms 43 of the two elastic structures 4 is equal to a quantity of the plurality of the contact portions 222 of the two flexible printed circuit boards 2. In the present invention, each elastic structure 4 has a simplified manufacturing process and an actuating arm of each elastic structure 4 is longer.

Referring to FIG. 2 and FIG. 3, the two latches 5 are fastened to the two receiving grooves 15 of the two sides of the insulating housing 1, and the two latches 5 are opposite to each other along the transverse direction. A rear end of each latch 5 has a gripper 51. The gripper 51 of each latch 5 has a holding groove 511 penetrating through a rear surface of the gripper 51. The gripper 51 is used for clamping the circuitry board (not shown). The circuitry board is received in the two holding grooves 511 of the two latches 5.

Referring to FIG. 1 to FIG. 3, the two shielding plates 6 surround the front end of the insulating housing 1. The two shielding plates 6 are fastened to the front end of the insulating housing 1. The two shielding plates 6 are fastened to the two concave surfaces 16 of the insulating housing 1. The two shielding plates 6 are opposite to each other along the up-down direction. Each shielding plate 6 has a base body 61 and a plurality of elastic pieces 62. The base bodies 61 of the two shielding plates 6 are fastened to the two concave surfaces 16 of the insulating housing 1, so that the two shielding plates 6 are located to the insulating housing 1, and the two shielding plates 6 are fixed to the insulating housing 1. One end edge of the base body 61 of each shielding plate 6 has the plurality of the elastic pieces 62. The plurality of the elastic pieces 62 are inclined frontward and inward, and then are arched inward.

Several portions of a front end edge of the base body 61 of each shielding plate 6 slantwise extend frontward and inward, and then are arched inward to form the plurality of the elastic pieces 62. The plurality of the elastic pieces 62 of each shielding plate 6 are spaced from one another. The plurality of the elastic pieces 62 of the two shielding plates 6 are fastened in the plurality of the perforations 17 of the insulating housing 1, so that the two shielding plates 6 are located to the insulating housing 1, and the two shielding plates 6 are fixed to the insulating housing 1. When the electrical connector 100 is docked with the docking connector (not shown), the plurality of the elastic pieces 62 of the two shielding plates 6 are used for keeping forces during a period of an insertion and a withdrawal of the electrical connector 100 and the docking connector (not shown), and the elastic pieces 62 of the two shielding plates 6 contacting with a grounding shell (not shown) of the docking connector (not shown). Specifically, each shielding plate 6 has three elastic pieces 62.

Referring to FIG. 1 to FIG. 7, the shell 7 is a hollow tube shape. The shell 7 surrounds the insulating housing 1, the two main portions 221 and the plurality of the contact portions 222 of the two signal layers 22 of the two flexible printed circuit boards 2, the two location blocks 3, the two elastic structures 4, the two latches 5 and the two shielding plates 6 so as to make the two flexible printed circuit boards 2, the two location blocks 3, the two elastic structures 4, the two latches 5 and the two shielding plates 6 fastened to the insulating housing 1 and fastened in the shell 7.

Referring to FIG. 1 to FIG. 6, in one condition, the outer ground layer 21, the signal layer 22 and the inner ground layer 23 of each flexible printed circuit board 2 have a plurality of corresponding through holes 91. The plurality of the through holes 91 penetrate through inner surfaces and outer surfaces of the outer ground layer 21, the signal layer 22 and the inner ground layer 23. The plurality of the through holes 91 of the outer ground layer 21, the signal layer 22 and the inner ground layer 23 are equipped with a plurality of copper foils 92. The plurality of the copper foils 92 are cylinder shapes. The two mesh structures 24 of the outer ground layer 21 and the inner ground layer 23 are connected with the plurality of the traces 220 of the signal layer 22 by virtue of the plurality of the copper foils 92 of the plurality of the through holes 91 being connected. The plurality of the through holes 91 and the plurality of the copper foils 92 are sparsely distributed in two outermost traces 220, two sides of the mesh structure 24 of the outer ground layer 21 and two sides of the mesh structure 24 of the inner ground layer 23 of each flexible printed circuit board 2. A quantity of the plurality of the through holes 91 is smaller, and correspondingly, a quantity of the plurality of the copper foils 92 is smaller. So the flexible printed circuit board 2 has a simple through hole process. The two outermost traces 220 are connected to two grounding portions of the plurality of the contact portions 222 of each flexible printed circuit board 2, and the outer ground layer 21 and the inner ground layer 23 are electrically connected to the two grounding portions of the plurality of the contact portions 222 of each flexible printed circuit board 2, so the outer ground layer 21 and the inner ground layer 23 are electrically isolated from signal portions of the plurality of the contact portions 222 of each flexible printed circuit board 2.

In another condition, the signal layer 22 of the electrical connector 100 is a single layer, and the plurality of the contact portions 222 and the soldering portion 223 of each trace 220 are exposed to the inner surface of the signal layer 22, so the through holes 91 of the signal layer 22 are unnecessary. The outer ground layer 21 and the inner ground layer 23 have the plurality of corresponding through holes 91. The plurality of the through holes 91 penetrate through the inner surfaces and the outer surfaces of the outer ground layer 21 and the inner ground layer 23. The plurality of the through holes 91 of the outer ground layer 21 and the inner ground layer 23 are equipped with the plurality of the copper foils 92. The two mesh structures 24 of the outer ground layer 21 and the inner ground layer 23 are partially exposed outside from the plurality of the through holes 91. The two mesh structures 24 of the outer ground layer 21 and the inner ground layer 23 are connected with the plurality of the traces 220 of the signal layer 22 by virtue of the plurality of the copper foils 92 of the plurality of the through holes 91. So a through hole process of the signal layer 22 of each flexible printed circuit board 2 is unnecessary.

As described above, a design of the electrical connector 100 is innovative, each flexible printed circuit board 2 includes the outer ground layer 21, the signal layer 22 and the inner ground layer 23. The outer ground layer 21 is disposed to the outer surface of the signal layer 22. The inner ground layer 23 is disposed to the inner surface of the signal layer 22. The outer ground layer 21 and the inner ground layer 23 are used for reducing the signal interference. The signal layer 22 has the signal transmission function and the power transmission function, so each flexible printed circuit board 2 has the better shielding function to reduce the electromagnetic interference so as to make that the electrical connector 100 transmits the signal more steadily. The two elastic structures 4 are used for providing the positive force of the electrical connector 100 during a period of the insertion and the withdrawal of the electrical connector 100, the front end of the fastening portion 41 extends frontward and then is arched inward to form the plurality of the elastic arms 43. The plurality of the elastic arms 43 of the two elastic structures 4 are attached to the two outer surfaces of the two outer ground layers 21 of the two flexible printed circuit boards 2, the plurality of the elastic arms 43 of the two elastic structures 4 are corresponding to the plurality of the contact portions 222 of the two flexible printed circuit boards 2, and the quantity of the plurality of the elastic arms 43 of the two elastic structures 4 is equal to the quantity of the plurality of the contact portions 222 of the two flexible printed circuit boards 2. As a result, the electrical connector 100 has a simplified manufacturing process and the simplified circuit layout, and lowers the cost of the electrical connector 100.

What is claimed is:
1. An electrical connector, comprising:
an insulating housing having a connecting element;
at least one flexible printed circuit board mounted in the insulating housing, the at least one flexible printed circuit board including an outer ground layer, a signal layer and an inner ground layer, the outer ground layer being disposed to an outer surface of the signal layer, the inner ground layer being disposed to an inner surface of the signal layer, the signal layer having a plurality of traces, each trace having a main portion, at least one contact portion and a soldering portion, at least one portion of a front end of the main portion extending frontward to form the at least one contact portion, a rear end of the main portion extending rearward to form the soldering portion;

at least one location block disposed to a middle of an outer surface of the at least one flexible printed circuit board, the at least one location block having a board body, a front end of an outer surface of the board body protruding outward to form at least one location portion, a rear end of the outer surface of the board body protruding outward to form a protruding portion;

at least one elastic structure disposed on a front end of an outer surface of the at least one location block, the at least one elastic structure having a fastening portion, and at least one location hole penetrating through an outer surface and an inner surface of the fastening portion, the at least one location portion being fastened to the at least one location hole, several portions of a front end of the fastening portion directly extending frontward and then being arched inward to form a plurality of elastic arms, the plurality of the elastic arms being fastened to an outer surface of the outer ground layer of the at least one flexible printed circuit board, and each elastic arm being corresponding to the at least one contact portion of the at least one flexible printed circuit board, a rear end of the fastening portion directly facing a front surface of the protruding portion; and a shell surrounding the insulating housing, the main portion and the at least one contact portion of the at least one flexible printed circuit board, the at least one location block and the at least one elastic structure, the fastening portion being located among the shell, the board body and the protruding portion;

wherein the connecting element, the flexible printed circuit board, the board body, the fastening portion and the shell are laminated from an inside to an outside.

2. The electrical connector as claimed in claim 1, wherein the electrical connector includes two flexible printed circuit boards, the two flexible printed circuit boards are both disposed horizontally, the two flexible printed circuit boards are mounted in the insulating housing, and the two flexible printed circuit boards are opposite to each other along an up-down direction, one flexible printed circuit board is mounted to a middle of an upper portion of the insulating housing and a rear of the upper portion of the insulating housing, the other flexible printed circuit board is mounted to a middle of a lower portion of the insulating housing and a rear of the lower portion of the insulating housing, each flexible printed circuit board includes the outer ground layer, the signal layer and the inner ground layer, the outer ground layer is disposed to the outer surface of the signal layer, the inner ground layer is disposed to the inner surface of the signal layer.

3. The electrical connector as claimed in claim 2, wherein the electrical connector includes two location blocks, the two location blocks are disposed horizontally, the two location blocks are mounted to a rear end of the insulating housing, and the two location blocks are opposite to each other along the up-down direction, the two location blocks are mounted to the rear of the upper portion and the rear of the lower portion of the insulating housing, respectively, the two location blocks are disposed on two outer surfaces of the two outer ground layers of the two flexible printed circuit boards, respectively, each location block has the board body, a rear end of an upper surface of the insulating housing is recessed inward to form at least one fastening groove, and a rear end of a lower surface of the insulating housing is recessed inward to form at least one fastening groove, at least one portion of the protruding portion of each location block protrudes outward to form at least one location foot, the at least two location feet of the two location blocks are fastened in the at least two fastening grooves of the insulating housing.

4. The electrical connector as claimed in claim 3, wherein the electrical connector includes two elastic structures, the two elastic structures are disposed horizontally, the two elastic structures are mounted in the insulating housing, and the two elastic structures are opposite to each other along the up-down direction, the two elastic structures are disposed on front ends of two outer surfaces of the two board bodies of the two location blocks, the two elastic structures project beyond front surfaces of the two board bodies, the two elastic structures are adjacent to two fronts of two outer surfaces of the two flexible printed circuit boards, each elastic structure has the fastening portion, two location holes and the plurality of the elastic arms, the fastening portion of each elastic structure is fastened to the front end of the outer surface of the board body of one location block, the two location holes penetrating through the outer surface and the inner surface of the fastening portion, two sides of the front end of the outer surface of the board body protrude outward to form two location portions, the two location portions of the two location blocks are fastened to the two location holes of the two elastic structures, several portions of the front end of the fastening portion extend frontward and then is arched inward to form the plurality of the elastic arms, front ends of the plurality of the elastic arms of the two elastic structures are attached to the two outer surfaces of the two outer ground layers of the two flexible printed circuit boards, and the front ends of the plurality of the elastic arms of the two elastic structures are fastened to the two outer surfaces of the two outer ground layers of the two flexible printed circuit boards.

5. The electrical connector as claimed in claim 1, wherein a middle of the outer ground layer and a middle of the inner ground layer are equipped with two mesh structures, the two mesh structures of the outer ground layer and the inner ground layer are corresponding to positions of an inner surface and an outer surface of the main portion of the signal layer.

6. The electrical connector as claimed in claim 5, wherein the outer ground layer, the signal layer and the inner ground layer have a plurality of corresponding through holes, the plurality of the through holes penetrate through inner surfaces and outer surfaces of the outer ground layer, the signal layer and the inner ground layer, the plurality of the through holes of the outer ground layer, the signal layer and the inner ground layer are equipped with a plurality of copper foils, the two mesh structures of the outer ground layer and the inner ground layer are connected with the plurality of the traces of the signal layer by virtue of the plurality of the copper foils of the plurality of the through holes being connected, the plurality of the through holes and the plurality of the copper foils are sparsely distributed in two outermost traces, two sides of the mesh structure of the outer ground layer and two sides of the mesh structure of the inner ground layer.

7. The electrical connector as claimed in claim 1, wherein a middle of the outer ground layer and a middle of the inner ground layer are equipped with two slice structures, the two slice structures of the outer ground layer and the inner ground layer are corresponding to positions of an inner surface and an outer surface of the main portion of the signal layer.

8. The electrical connector as claimed in claim 1, wherein the insulating housing has a plurality of fastening grooves, the insulating housing has an upper body and a lower body, two top surfaces of two opposite sides of a rear end of the upper body are recessed inward to form two fastening grooves penetrating through two facing inner surfaces of the two opposite sides of the rear end of the upper body, the two fastening grooves of the upper body are aligned along a transverse direction, two bottom surfaces of two opposite sides of a rear end of the lower body are recessed inward to form another two fastening grooves penetrating through two facing inner surfaces of the two opposite sides of the rear end of the lower body, the two fastening grooves of the lower body are aligned along the transverse direction, the electrical connector includes two location blocks, the rear end of the outer surface of the board body of each location block protrudes outward to form the protruding portion, middles of two opposite sides of the protruding portion of each location block protrude outward to form two location feet, the two location feet of each location block are fastened in the two fastening grooves of one of the upper body and the lower body.

9. The electrical connector as claimed in claim 8, wherein the insulating housing has an interval penetrating through middles and the rear ends of the upper body and the lower body, the connecting element of the insulating housing is connected among two bottoms of two side walls of the upper body of the insulating housing and two tops of two side walls of the lower body of the insulating housing, the connecting element is located in a rear end of the interval and is located among the plurality of the fastening grooves, the connecting element is shown as a rectangular shape, the connecting element is located between and abuts between the two flexible printed circuit boards, the connecting element separates the two flexible printed circuit boards.

10. The electrical connector as claimed in claim 9, wherein an upper surface and a lower surface of a front end of the insulating housing are recessed inward to form two concave surfaces, the two concave surfaces are disposed along an up-down direction, the two concave surfaces are opposite to each other, the front end of the insulating housing defines an accommodating space penetrating through a front surface of the insulating housing along a longitudinal direction, the accommodating space is communicated between the interval and an outside space, the electrical connector further includes two shielding plates, the two shielding plates are mounted to the two concave surfaces of the insulating housing.

11. The electrical connector as claimed in claim 10, wherein an upper surface of a front end of the upper body is recessed inward to form one concave surface, and a lower surface of a front end of the lower body is recessed inward to form the other concave surface, the accommodating space is surrounded between the front end of the upper body and the front end of the lower body, the two concave surfaces of the insulating housing defines a plurality of the perforations penetrating through a top wall and a bottom wall of the accommodating space, the plurality of the perforations penetrate through two front ends of two middles of the two concave surfaces, the plurality of the perforations penetrate through the front end of the upper body and the front end of the lower body along the up-down direction, the plurality of the perforations are located in front of the interval, each shielding plate has a plurality of elastic pieces, the plurality of the elastic pieces of the two shielding plates are fastened in the plurality of the perforations.

12. The electrical connector as claimed in claim 10, wherein the two shielding plates are mounted to the front end of the insulating housing, and the two shielding plates are opposite to each other along the up-down direction, each elastic structure is located between one location block and one shielding plate, each shielding plate has a base body, several portions of a front end edge of the base body of each shielding plate slantwise extend frontward and inward, and then are arched inward to form a plurality of elastic pieces, the two concave surfaces of the insulating housing defines a plurality of perforations penetrating through a top wall and a bottom wall of the accommodating space, the plurality of the elastic pieces of each shielding plate are spaced from one another, the plurality of the elastic pieces of the two shielding plates are fastened in the plurality of the perforations.

13. The electrical connector as claimed in claim 10, wherein two middles and two rear ends of the two side walls of the upper body are spaced from two middles and two rear ends of the two side walls of the lower body to form two receiving grooves among the two middles and the two rear ends of the two side walls of the upper body and the two middles and the two rear ends of the two side walls of the lower body, the two receiving grooves are disposed to two opposite sides of the insulating housing, the two receiving grooves are abreast disposed along the transverse direction, each receiving groove extends along a longitudinal direction, the two receiving grooves are opposite to each other, the electrical connector further includes two latches, the two latches are located in the two receiving grooves.

14. An electrical connector, comprising:
an insulating housing;
a signal layer mounted in the insulating housing, the signal layer having a plurality of traces, each trace having a main portion, at least one portion of a front end of the main portion extending frontward to form at least one contact portion, a rear end of the main portion extending rearward to form a soldering portion;
an outer ground layer disposed to an outer surface of the signal layer;
an inner ground layer disposed to an inner surface of the signal layer;
at least one location block disposed to a middle of an outer surface of the outer ground layer, the at least one location block having a board body, a front end of an outer surface of the board body protruding outward to form at least one location portion, a rear end of the outer surface of the board body protruding outward to form a protruding portion;
at least one elastic structure disposed on a front end of an outer surface of the at least one location block, the at least one elastic structure having a fastening portion, and at least one location hole penetrating through an outer surface and an inner surface of the fastening portion, the at least one location portion being fastened to the at least one location hole, several portions of a front end of the fastening portion directly extending frontward and then being arched inward to form a plurality of elastic arms, the plurality of the elastic arms being fastened to the outer surface of the outer ground layer, and each elastic arm being corresponding to the at least one contact portion, a rear end of the fastening portion directly facing a front surface of the protruding portion; and a shell surrounding the insulating housing, the main portion and the at least one contact portion of the signal layer, the outer ground layer, the inner ground layer, the at least one location block and the at least one elastic structure, the fastening portion being located among the shell, the board body and the protruding portion;

wherein the connecting element, the inner ground layer, the signal layer, the outer ground layer, the board body, the fastening portion and the shell are laminated from an inside to an outside.

15. An electrical connector, comprising:

an insulating housing having an upper body, a lower body, and a connecting element connected between the upper body and the lower body;

two flexible printed circuit boards, one flexible printed circuit board being mounted to an upper portion of the insulating housing, the other flexible printed circuit board being mounted to a lower portion of the insulating housing, the two flexible printed circuit boards being opposite to each other along an up-down direction, the two flexible printed circuit boards being separated by the connecting element, each flexible printed circuit board including an outer ground layer, a signal layer and an inner ground layer, the outer ground layer being disposed to an outer surface of the signal layer, the inner ground layer being disposed to an inner surface of the signal layer, the signal layer having a plurality of traces, each trace having a main portion, at least one portion of a front end of the main portion extending frontward to form at least one contact portion, a rear end of the main portion extending rearward to form a soldering portion;

two location blocks disposed to two outer surfaces of the two outer ground layers of the two flexible printed circuit boards, the two location blocks being corresponding to the two main portions of the two signal layers of the two flexible printed circuit boards, each location block including a board body, a front end of an outer surface of the board body protruding outward to form at least one location portion, a rear end of the outer surface of the board body protruding outward to form a protruding portion;

two elastic structures disposed to the two front ends of the two outer surfaces of the two board bodies of the two location blocks, each elastic structure having a fastening portion, and at least one location hole penetrating through an outer surface and an inner surface of the fastening portion, the at least one location portion being fastened to the at least one location hole, several portions of a front end of the fastening portion directly extending frontward and then being arched inward to form a plurality of elastic arms, front ends of the plurality of the elastic arms of the two elastic structures being attached to the two outer surfaces of the two outer ground layers of the two flexible printed circuit boards, and the plurality of the elastic arms of the two elastic structures being corresponding to the plurality of the contact portions of the two flexible printed circuit boards, a rear end of the fastening portion directly facing a front surface of the protruding portion; and a shell surrounding the insulating housing, the two main portions and the plurality of the contact portions of the two signal layers of the two flexible printed circuit boards, the two location blocks and the two elastic structures the fastening portion being located among the shell, the board body and the protruding portion;

wherein the connecting element, the flexible printed circuit board, the board body, the fastening portion and the shell are laminated from an inside to an outside.

* * * * *